US010879871B2

(12) United States Patent
Tai et al.

(10) Patent No.: US 10,879,871 B2
(45) Date of Patent: Dec. 29, 2020

(54) ELASTIC WAVE ELEMENT AND METHOD FOR MANUFACTURING SAME

(71) Applicant: NGK INSULATORS, LTD., Nagoya (JP)

(72) Inventors: Tomoyoshi Tai, Inazawa (JP); Masahiko Namerikawa, Seto (JP); Takashi Yoshino, Ama (JP)

(73) Assignee: NGK INSULATORS, LTD.

( * ) Notice: Subject to any disclaimer, the term of this patent is extended or adjusted under 35 U.S.C. 154(b) by 0 days.

(21) Appl. No.: 16/670,462

(22) Filed: Oct. 31, 2019

(65) Prior Publication Data
US 2020/0067480 A1 Feb. 27, 2020

Related U.S. Application Data

(63) Continuation of application No. PCT/JP2018/005882, filed on Feb. 20, 2018.

(30) Foreign Application Priority Data

May 2, 2017 (JP) .................................. 2017-091641

(51) Int. Cl.
*H03H 9/02* (2006.01)
*H01L 41/313* (2013.01)
(Continued)

(52) U.S. Cl.
CPC ....... *H03H 9/02834* (2013.01); *H01L 41/313* (2013.01); *H03H 3/10* (2013.01); *H03H 9/0585* (2013.01); *H03H 9/25* (2013.01)

(58) Field of Classification Search
CPC ........ H03H 9/02; H03H 9/02834; H03H 3/10; H03H 9/25; H03H 9/0585; H01L 41/313
See application file for complete search history.

(56) References Cited

U.S. PATENT DOCUMENTS 6,445,265 B1 * 9/2002 Wright ..................... H03H 3/08
333/193
7,213,314 B2 5/2007 Abbott et al.
(Continued)

FOREIGN PATENT DOCUMENTS

CN 203851109 U 9/2014
JP 07-038360 A 2/1995
(Continued)

OTHER PUBLICATIONS

Japanese language International Search Report and Written Opinion for corresponding PCT/JP2018/005882, dated Apr. 3, 2018 (7 pages).
(Continued)

*Primary Examiner* — J. San Martin
(74) *Attorney, Agent, or Firm* — Flynn Thiel, P.C.

(57) ABSTRACT

In an acoustic wave device including a piezoelectric material substrate and supporting body bonded with each other through a bonding layer, it is an object to provide the acoustic wave device having the structure for further improving the propagation loss and temperature characteristics of frequency of an acoustic wave. An acoustic wave device includes a piezoelectric material substrate, an electrode on the piezoelectric material substrate, a supporting body, and a bonding layer for bonding the piezoelectric material substrate and the supporting body. The bonding layer is composed of quartz crystal.

7 Claims, 5 Drawing Sheets

(51) Int. Cl.
*H03H 3/10* (2006.01)
*H03H 9/05* (2006.01)
*H03H 9/25* (2006.01)

(56) References Cited

U.S. PATENT DOCUMENTS

| | | | |
|---|---|---|---|
| 7,331,092 B2* | 2/2008 | Miura | H03H 3/08 |
| | | | 204/192.18 |
| 7,609,129 B2* | 10/2009 | Yokota | H03H 9/02574 |
| | | | 333/133 |
| 9,577,178 B2* | 2/2017 | Iwamoto | H03H 3/04 |
| 9,647,199 B2* | 5/2017 | Ito | H03H 3/02 |
| 2006/0202781 A1* | 9/2006 | Pahl | H03H 9/0585 |
| | | | 333/193 |
| 2007/0189689 A1 | 8/2007 | Yamaguchi et al. | |
| 2010/0276723 A1* | 11/2010 | Utsumi | C03C 27/06 |
| | | | 257/99 |
| 2013/0111719 A1* | 5/2013 | Deguet | H01L 41/22 |
| | | | 29/25.35 |
| 2017/0179371 A1 | 6/2017 | Kitamura et al. | |
| 2017/0222622 A1* | 8/2017 | Solal | H03H 9/562 |
| 2019/0036509 A1* | 1/2019 | Tai | H03H 9/02622 |
| 2019/0074819 A1* | 3/2019 | Goto | H03F 3/245 |
| 2019/0222189 A1* | 7/2019 | Tai | H03H 9/02574 |
| 2020/0186119 A1* | 6/2020 | Yamamoto | H03H 9/14541 |

FOREIGN PATENT DOCUMENTS

| | | |
|---|---|---|
| JP | 2005-065050 A | 3/2005 |
| JP | 2012-053488 A | 3/2012 |
| JP | 3187231 U | 11/2013 |
| JP | 2014-086400 A | 5/2014 |
| WO | 2017/047604 A1 | 3/2017 |

OTHER PUBLICATIONS

English language International Search Report for corresponding PCT/JP2018/005882, dated Apr. 3, 2018 (1 page).
English translation of International Preliminary Report on Patentability and Written Opinion for corresponding PCT/JP2018/005882, dated Apr. 3, 2018 (7 pages).
Chinese Office Action issued in corresponding Chinese Application No. 201880025872.X dated May 22, 2020 (8 pages).

* cited by examiner

ELASTIC WAVE ELEMENT AND METHOD FOR MANUFACTURING SAME

CROSS-REFERENCE TO RELATED APPLICATIONS

This application is a continuation application of PCT/JP2018/005882, filed Feb. 20, 2018, which claims priority to Japanese Application No. 2017-091641, filed May 2, 2017, the entire contents all of which are incorporated hereby by reference.

TECHNICAL FIELD

The present invention provides an acoustic wave device and a method of producing the same.

BACKGROUND ARTS

It is known a surface acoustic wave device functioning as a filter device or oscillator used in mobile phones or the like and an acoustic wave device such as lamb wave device or film bulk acoustic resonator (FBAR) using a piezoelectric thin film. As such surface acoustic wave device, it is known a device produced by adhering a supporting body and a piezoelectric material substrate propagating a surface acoustic wave and by providing interdigitated electrodes capable of oscillating the surface acoustic wave on a surface of the piezoelectric material substrate. By adhering the supporting body whose thermal expansion coefficient is lower than that of the piezoelectric material substrate onto the piezoelectric substrate, the change of a size of the piezoelectric material substrate responsive to temperature change is reduced so that the change of the frequency characteristics as the surface acoustic wave device is reduced.

Here, in the case that a piezoelectric material substrate and silicon substrate are bonded with each other, it is known that a silicon oxide film is formed on a surface of the piezoelectric material substrate and that the piezoelectric material substrate and silicon substrate are directly bonded through the silicon oxide film (Patent document 1). During the bonding, plasma beam is irradiated onto the surfaces of the silicon oxide film and a silicon substrate to activate the surfaces, which are subjected to direct bonding (plasma activation method).

Further, according to disclosure of patent document 2, a piezoelectric material substrate such as lithium tantalate or the like is bonded with a separate piezoelectric material substrate to improve the temperature characteristics of frequency of an acoustic wave device. In this case, it is further described that silicon or a silicon compound may be interposed between the two piezoelectric material substrates to suppress generation of unbonded parts.

RELATED TECHNICAL ARTS

Patent Documents (Patent document 1) U.S. Pat. No. 7,213,314 B2
(Patent document 2) Japanese Patent Publication No. 1995-038360A
(Patent document 3) Japanese Patent Publication No. 2014-086400A

SUMMARY OF THE INVENTION

According to the acoustic wave device described in patent document 1, the silicon oxide film is formed on the piezoelectric material substrate and then directly bonded with the silicon substrate. However, according to such acoustic wave device, it is difficult to improve the propagation loss and temperature change of frequency of acoustic wave above a certain level.

On the other hand, according to the acoustic wave device of patent document 2, the propagation loss and temperature characteristics of frequency of acoustic wave are relatively larger and it is difficult to improve them above certain levels.

An object of the present invention is, in an acoustic wave device including a piezoelectric material substrate and supporting body bonded with each other through a bonding layer, to provide the acoustic wave device having the structure for further improving the propagation loss and temperature characteristics of frequency of an acoustic wave.

The present invention provides an acoustic wave device comprising:
  a piezoelectric material substrate;
  an electrode on the piezoelectric material substrate;
  a supporting body; and
  a bonding layer for bonding the piezoelectric material substrate and supporting body,
  wherein the bonding layer comprises quartz crystal.

The present invention further provides a method of producing an acoustic wave device, the method comprising the steps of:
  bonding a piezoelectric material substrate and a quartz crystal plate;
  processing the quartz crystal plate to form a bonding layer:
  bonding the bonding layer and the supporting body; and
  forming an electrode on the piezoelectric material substrate.

The inventors have researched the reasons that the improvement of the propagation loss and temperature characteristics of frequency is limited in the acoustic wave devices described in patent documents 1 and 2. That is, the reasons are as follows. In the case that the silicon oxide film is formed on the piezoelectric material substrate, the silicon oxide film is not epitaxially grown and is of amorphous state so that its crystallinity is poor. The acoustic wave is thus leaked to result in the propagation loss, and binding force by the supporting body is thereby lowered so that the temperature change of frequency tends to be large.

Further, in the case that the piezoelectric material substrate is bonded to the separate piezoelectric material substrate (for example quartz crystal plate) to produce the acoustic wave device, the acoustic wave is leaked into and absorbed by the quartz crystal plate. It is thus difficult to reduce the insertion loss and the binding force applied onto the piezoelectric material substrate by the quartz crystal plate is limited. It is thereby proved to be difficult to improve the temperature change of frequency.

On the other hand, according to the present invention, a piezoelectric material substrate is bonded to a separate supporting body through a bonding layer composed of quartz crystal. As quartz crystal is a single crystal and the bonding layer of quartz crystal is bonded to the separate supporting body, the leakage of the acoustic wave from the piezoelectric material substrate to the bonding layer is suppressed. Further, as the piezoelectric material substrate can be bound by the supporting body, it is possible to reduce the temperature characteristics of frequency can be reduced at the same time.

BRIEF DESCRIPTION OF THE DRAWINGS

FIG. 1(*a*) is a front view showing a piezoelectric material substrate 2 and a quartz crystal plate 1, FIG. 1(*b*) is a front view showing a bonded body of the piezoelectric material substrate 1 and quartz crystal plate 2, and FIG. 1(*c*) shows the state that the quartz crystal plate 1 is processed to form a bonding layer 1A.

FIG. 2(*a*) shows the state that the piezoelectric material substrate 2 and a supporting body 3 are bonded with each other, FIG. 2(*b*) shows the state that the piezoelectric material substrate 2 is processed and thinned, and FIG. 2(*c*) shows an acoustic wave device 5.

FIG. 3(*a*) is a front view showing a piezoelectric material substrate 2, a quartz crystal plate 1 and an intermediate layer 6 on piezoelectric material substrate side, FIG. 3(*b*) is a front view showing a bonded body of the piezoelectric material substrate 2 and quartz substrate 1, and FIG. 3(*c*) shows the state that the quartz crystal plate 1 is processed to form a bonding layer 1A.

FIG. 4(*a*) shows the state that a piezoelectric material substrate 2 and supporting body 3 are bonded with each other, FIG. 4(*b*) shows the state that the piezoelectric material substrate 2 is processed and thinned, and FIG. 4(*c*) shows an acoustic wave device 5A.

FIG. 5(*a*) shows a piezoelectric material substrate 2, supporting body 3 and silicon oxide films 8, 9, FIG. 5(*b*) shows the state that the piezoelectric material substrate 2 and supporting body 3 are bonded with each other through a bonding layer 10, and FIG. 5(*c*) shows an acoustic wave device 15 of a comparative example.

EMBODIMENTS FOR CARRYING OUT THE INVENTION

The present invention will be described further in detail, referring to the attached drawings.

Figures 1A, 1B, 1C:
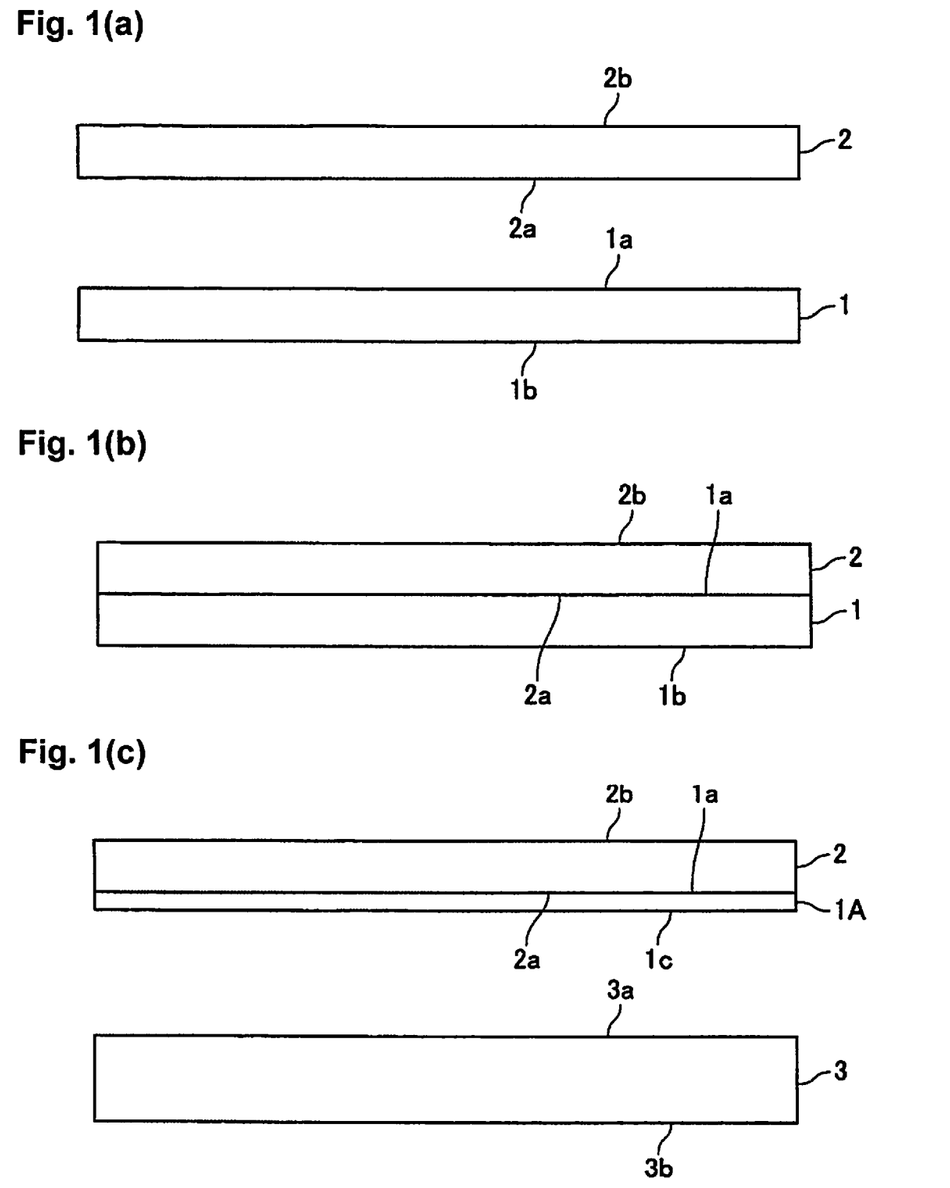

For example, as shown in FIG. 1(*a*), a piezoelectric material substrate 2 and quartz crystal plate 1 are prepared. A main face 2*a* of the piezoelectric material substrate 2 and main face 1*a* of the quartz crystal plate 1 are made bonding surfaces. Then, as shown in FIG. 1(*b*), the piezoelectric material substrate 2 and quartz crystal plate 1 are directly bonded. Then, as shown in FIG. 1(*c*), the main face 1*b* of the quartz substrate 1 is processed to a predetermined thickness to obtain a bonding layer 1A composed of quartz crystal. The bonding surface 3*a* of a separate supporting body 3 is opposed to the bonding surface 1*c* of the bonding layer 1A. 3*b* represents a bottom face of a supporting body 3.

Figures 2A, 2B, 2C:
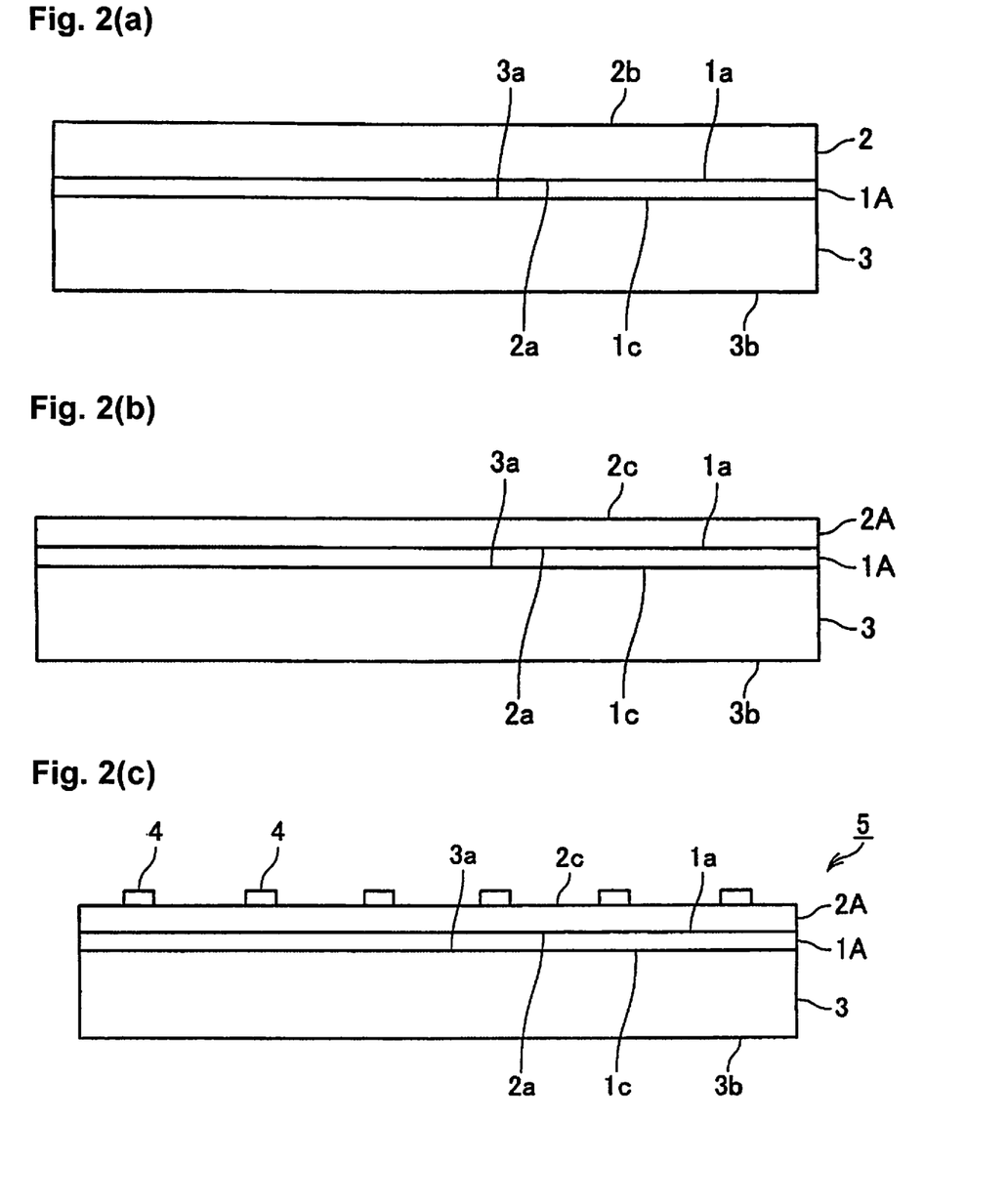

Then, as shown in FIG. 2(*a*), the bonding surface 3*a* of the supporting body 3 is directly bonded with the bonding surface 1*c* of the bonding layer 1A. At this state, although an electrode may be provided on the piezoelectric material substrate 2, preferably, as shown in FIG. 2(*b*), the main face 2*b* of the piezoelectric material substrate 2 is processed to thin the piezoelectric material substrate 2 to obtain a thinned piezoelectric material substrate 2A. 2*c* represents a processed surface. Then, as shown in FIG. 2(*c*), a predetermined electrode 4 is formed on the processed surface 2*c* of the piezoelectric material substrate 2A to obtain an acoustic wave device 5.

According to the examples shown in FIGS. 1 and 2, the piezoelectric material substrate 2 and quartz crystal plate 1 are directly bonded, and the bonding layer 1A and supporting body 3 are directly bonded with each other. However, it may be provided an intermediate layer on the side of the piezoelectric material substrate is provided on the piezoelectric material substrate 2 and bonding layer 1A, and an intermediate layer on the supporting body side may be provided between the supporting body 3 and bonding layer 1A. It is possible to further improve the bonding strength by the intermediate layer (intermediate layer on the side of the piezoelectric material substrate or on the side of the supporting body). FIGS. 3 and 4 relate to this embodiment.

Figure 3A:
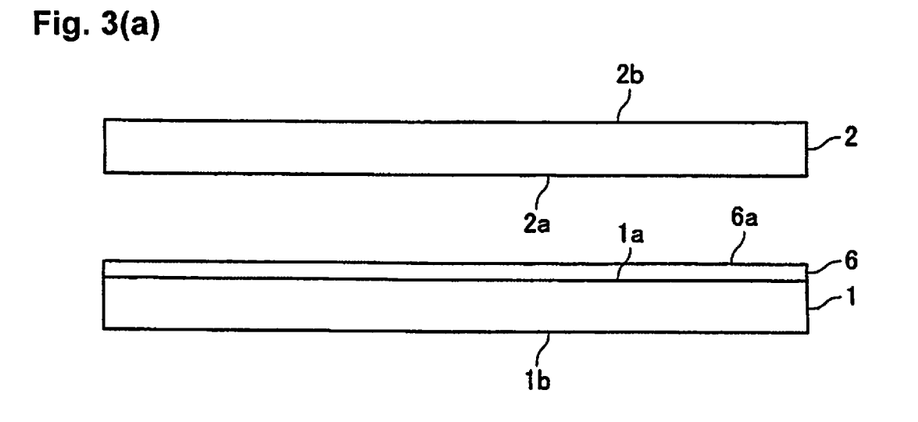
Figure 3B:
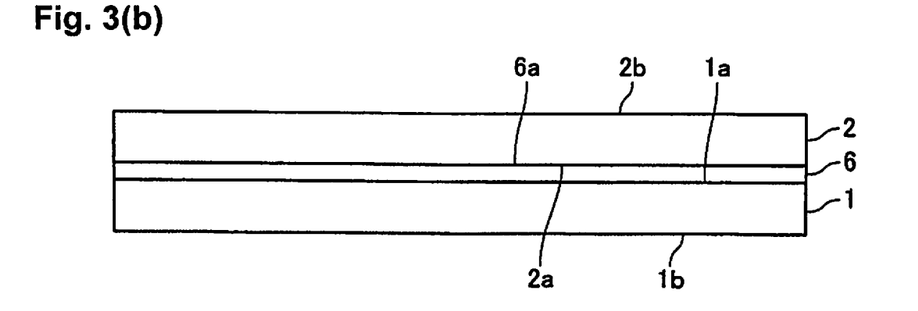

That is, as shown in FIG. 3(*a*), it is prepared a piezoelectric material substrate 2 and quartz crystal plate 1. It is formed an intermediate layer on the side of the piezoelectric material substrate 6 on the bonding surface 1*a* of the quartz substrate 1. Then, as shown in FIG. 3(*b*), the bonding surface 2*a* of the piezoelectric material substrate 2 and the surface 6*a* of the piezoelectric material substrate 6 are bonded with each other. Further, according the present example, the intermediate layer 6 on the side of the piezoelectric material substrate is provided on the quartz crystal plate 1, and the intermediate layer 6 on the side of the piezoelectric material substrate may be provided on the bonding surface 2*a* of the piezoelectric material substrate 2. Further, as a method of forming the intermediate layer 6 on the side of the piezoelectric material substrate, the intermediate layers may be formed as films on the quartz crystal plate 1 and piezoelectric material substrate 2, respectively, and both intermediate layers may be bonded and integrated.

Figure 3C:
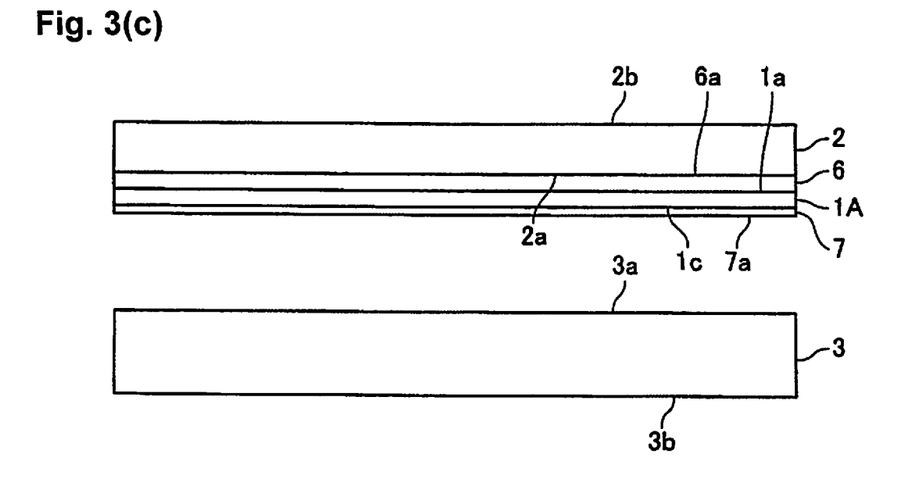

Then, as shown in FIG. 3(*c*), the quartz crystal plate 1 is processed to a predetermined thickness to obtain the bonding layer 1A composed of quartz crystal. Here, according to the present example, an intermediate layer 7 on the side of the supporting body may be further provided on the bonding surface 1*c* of the bonding layer 1A. Then, the bonding surface 3*a* of a separate supporting body 3 is opposed to the bonding surface 7*a* of the intermediate layer 7 on the side of the supporting body. 3*b* represents a bottom surface of the supporting body 3.

Figure 4A:
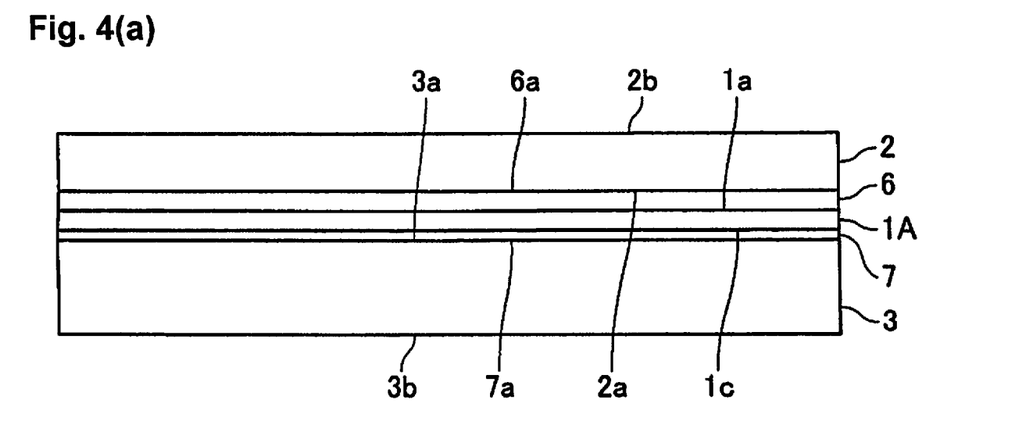

Then, as shown in FIG. 4(*a*), the bonding surface 3*a* of the supporting body 3 and bonding surface 7*a* of the intermediate layer 7 are directly bonded with each other. However, according to the present example, the intermediate layer 7 on the side of the supporting body is provided on the bonding layer 1A composed of quartz crystal, and the intermediate layer 7 on the side of the supporting body may be provided on the bonding surface 3*a* of the supporting body 3. Further, as the method of forming the intermediate layer 7 on the side of the supporting body, both of intermediate layers may be formed on the bonding layer 1A composed of quartz crystal and supporting body 3, respectively, and then bonded with each other and integrated.

Figure 4B:
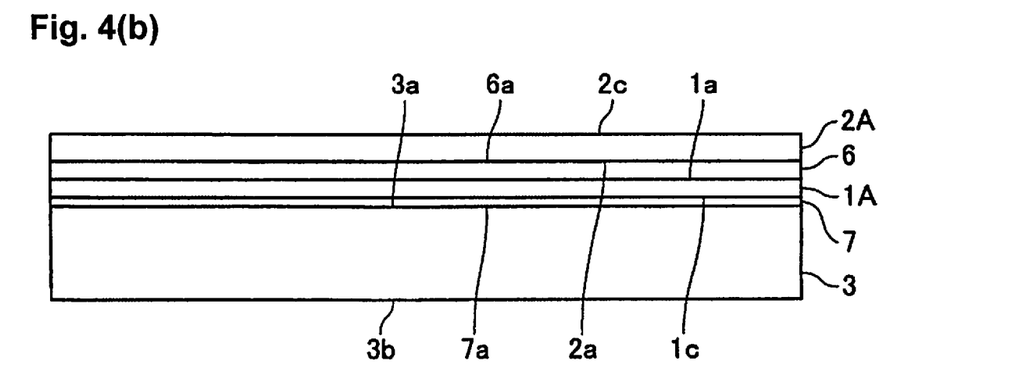
Figure 4C:
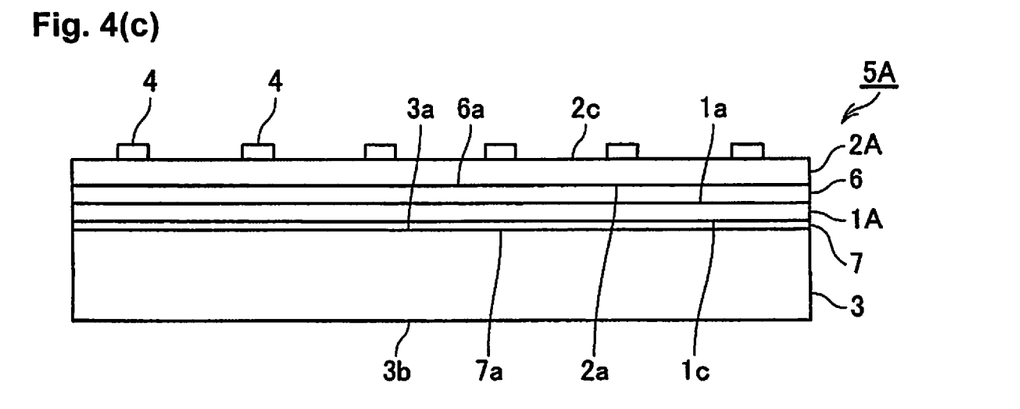

At the state shown in FIG. 4(*a*), although an electrode may be provided on the piezoelectric material substrate 2, preferably, as shown in FIG. 4(*b*), the main face 2*b* of the piezoelectric material substrate 2 may be processed to thin the substrate 2A to obtain the thinned piezoelectric material substrate 2A. 2*c* represents a processed surface. Then, as shown in FIG. 4(*c*), a predetermined electrode 4 may be formed on the processed surface 2*c* of the piezoelectric material substrate 2 to obtain a piezoelectric material substrate 5A. Further, according to the embodiments described above (FIG. 3(*a*) to FIG. 4(*c*)), the acoustic wave device 5A includes the intermediate layer 6 on the side of the piezoelectric material substrate and intermediate layer 7 on the side of the supporting body. The invention is not limited to this embodiment, and only either one of the intermediate layers (only the intermediate layer 6 on the side of the piezoelectric material substrate or intermediate layer 7 on the side of the supporting body) may be provided.

Respective constituents of the present invention will be described further in detail below.

As acoustic wave devices 5 and 5A, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave, on the surface of the piezoelectric single crystal substrate. By applying high frequency signal on the IDT electrode on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A metal film may be provided on a bottom surface of the piezoelectric single crystal substrate 1A. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface of the piezoelectric substrate 2 or 2A and that the metal film on the piezoelectric substrate 2 or 2A is exposed through a cavity provided in the supporting body. Materials of such metal films include aluminum, an aluminum alloy, copper, gold or the like, for example. Further, in the case that the Lamb type wave device is produced, it may be used a composite substrate having the piezoelectric substrate without the metal film on the bottom surface.

Further, a metal film and an insulating film may be provided on the bottom surface of the piezoelectric material substrate 2 or 2A. The metal film plays a role of electrodes in the case that the thin film resonator is produced as the acoustic wave device. In this case, the thin film resonator has the structure that electrodes are formed on the upper and bottom surfaces of the piezoelectric substrate and the insulating film is made a cavity to expose the metal film on the piezoelectric substrate 2 or 2A. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

The materials forming electrode patterns on the piezoelectric material substrates 2 and 2A may preferably be aluminum, aluminum alloy, copper or gold, and more preferably be aluminum or aluminum alloy. The aluminum alloy used may preferably be Al mixed with 0.3 to 5 weight percent of Cu. In this case, Cu may preferably be replaced with Ti, Mg, Ni, Mo or Ta.

The piezoelectric material substrates 2, 2A used in the present invention may be made of a single crystal. In the case that the material of the piezoelectric material substrate 2 or 2A is the single crystal, it is easy to activate the surfaces of the piezoelectric material substrates 2 and 2A. However, in the case that the intermediate layer is provided on the surface of the piezoelectric material substrate 2 or 2A, the bonding surface of the intermediate layer can be activated, so that the piezoelectric material substrate 2 or 2A may not be a single crystal and the surface may be a roughened surface.

Specifically, the materials of the piezoelectric material substrates 2 and 2A include lithium tantalate (LT) single crystal, lithium niobate (LN) single crystal, single crystal of lithium niobate-lithium tantalate solid solution, quartz and lithium borate. Among them, LT or LN is more preferred. As LT or LN has a high propagation speed of a surface acoustic wave and large electro-mechanical coupling factor, it is preferred for use in a piezoelectric surface wave device for high frequency and wide-band frequency applications. Further, the normal direction of the main surface 2a or 2b of the piezoelectric material substrate 2 or 2A is not particularly limited. However, in the case that the piezoelectric material substrate 2 or 2A is made of LT, for example, it is preferred to use the substrate rotated toward Y-axis or Z-axis by 36 to 47° (for example 42°) with respect to X-axis, which is a direction of propagation of a surface acoustic wave, because of a low propagation loss. In the case that the piezoelectric material substrate 2 or 2A is made of LN, it is preferred to use the substrate rotated toward Y-axis or Z-axis by 60 to 68° (for example 64°) with respect to X-axis, which is a direction of propagation of a surface acoustic wave, because of a lower propagation loss. Further, although the size of the piezoelectric material substrate 2 or 2A is not particularly limited, for example, the diameter may be 50 to 150 mm and thickness may be 0.2 to 60 μm.

The material of the supporting body 3 may preferably be made of a material selected from the group consisting of silicon, sialon, mullite, sapphire and translucent alumina. It is thus possible to further improve the temperature characteristics of frequency of the acoustic wave device 5 or 5A.

According to the present invention, the bonding layer 1A of the piezoelectric material substrate 2 or 2A and supporting body 3 is composed of quartz crystal. Quartz crystal means a single crystal of trigonal system of $SiO_2$.

On the viewpoint of insertion loss and temperature characteristics of frequency of acoustic wave, the thickness of the bonding layer 1A may preferably be 0.05 μm or larger, more preferably be 0.1 μm or larger, and most preferably be 0.5 μm or larger. On the viewpoint of insertion loss and temperature characteristics of frequency of acoustic wave, the thickness of the bonding layer 1A may preferably be 30 μm or smaller, more preferably be 25 μm or smaller, further preferably be 20 μm or smaller, particularly preferably be 15 μm or smaller, and most preferably be 10 μm or smaller. As described later, the thickness of the bonding layer 1A is made 0.05 μm or larger and 30 μm or smaller, so that it is possible to produce the acoustic wave device having good temperature characteristics of frequency and low propagation loss of acoustic wave while the bonding strength can be maintained.

In the case that it is provided the intermediate layer 6 on the side of the piezoelectric material substrate and intermediate layer 7 on the side of supporting body, the material is one or more material(s) selected from the group consisting of tantalum pentoxide, niobium pentoxide, titanium oxide and a high-resistant silicon. It is possible to further improve the bonding strength of the supporting body 3 and piezoelectric material substrate 2 or 2A, by providing the intermediate layer.

The thicknesses of the intermediate layer 6 on the side of the piezoelectric material substrate and intermediate layer 7 on the side of the supporting body may preferably be 0.01 μm or larger and more preferably be 0.05 μm or larger, on the viewpoint of bonding strength. Further, on the viewpoint of insertion loss and temperature characteristics of frequency, the thickness may preferably be 0.2 μm or smaller and more preferably be 0.1 μm or smaller.

The method of forming each of the intermediate layer 6 on the side of the piezoelectric material substrate and the intermediate layer 7 on the side of the supporting body is not limited, and includes sputtering, chemical vapor deposition (CVD) and vapor deposition methods.

In the case that the bonding surface 2a of the piezoelectric material substrate 2, the bonding surface 1a of the quartz crystal plate 1 and bonding surface 3a of the supporting body 3 are subjected to direct bonding, the bonding surfaces may preferably be subjected to flattening followed by activation. Further, in the case that the intermediate layer 6 on the side of the piezoelectric material substrate is provided on the bonding layer 2a of the piezoelectric material substrate 2 and that the intermediate layer 7 on the side of the supporting body is provided on the bonding surface 3a of the supporting body 3, the bonding surfaces 6a and 7a of the intermediate layers 6 and 7 are subjected to flattening, followed by activation. In the case that the intermediate layer 6 on the side of the piezoelectric material substrate is provided on the bonding surface 2a of the piezoelectric material substrate 2, the bonding surface 2a of the piezoelectric material substrate 2 may be subjected to roughening process.

The roughened surface means a surface with periodic unevenness uniformly formed in the plane, with an arithmetic average surface roughness Ra of 0.05 µm≤Ra≤0.5 µm and with a height Ry from the minimum height at the bottom of valley and to the maximum height at the peak of the mountain of 0.5 µm≤Ry≤5 µm. Preferred roughness depends on the wavelength of the acoustic wave and is appropriately selected so that the reflection of bulk wave is suppressed.

Further, the method of roughening process includes grinding, polishing, etching, sand blasting and the like.

The method of flattening each of the bonding surfaces 1a, 2a, 3a, 6a, 7a includes lapping, chemical mechanical polishing (CMP) and the like. Further, the flattened face may preferably have Ra of 1 nm or less and more preferably have Ra of 3 nm or less.

Then, as the method of activating each of bonding surfaces 1a, 2a, 3a, 6a and 7a, preferably, neutralized beam is irradiated onto each of the bonding surfaces 1a, 2a, 3a, 6a and 7a.

When the activation of the surfaces is performed using the neutralized beam, it is preferred to use a system described in patent document 3 to generate the neutralized beam, which is irradiated. That is, it is used a high-speed atomic beam source of saddle field type as the beam source. Then, an inert gas is introduced into the chamber and a high voltage is applied onto electrodes from a direct current electric source. By this, electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high speed atomic beam source. Atomic species forming the beam may preferably be an inert gas (argon, nitrogen or the like).

A voltage during the activation by the irradiation of the beam may preferably be 0.5 to 2.0 kV and current is preferably 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

Further, each of the bonding surfaces 1a, 2a, 3a, 6a and 7a is flattened and then subjected to surface activation by plasma irradiation method. Plasma ($N_2$, $NH_3$, $O_2$, Ar or the like) is irradiated onto each bonding surface under low vacuum pressure (~10 Pa) to activate the bonding surfaces. After the irradiation, the substrates are drawn to the atmosphere and the bonding surfaces are contacted with each other to perform the bonding to provide a bonded body. After the bonding, the bonded body is heated at 200° C. to 300° C. to improve the bonding strength.

EXAMPLES

Comparative Example 1

An acoustic wave device 15 was produced, according to the method described referring to FIG. 5.

Figure 5A:
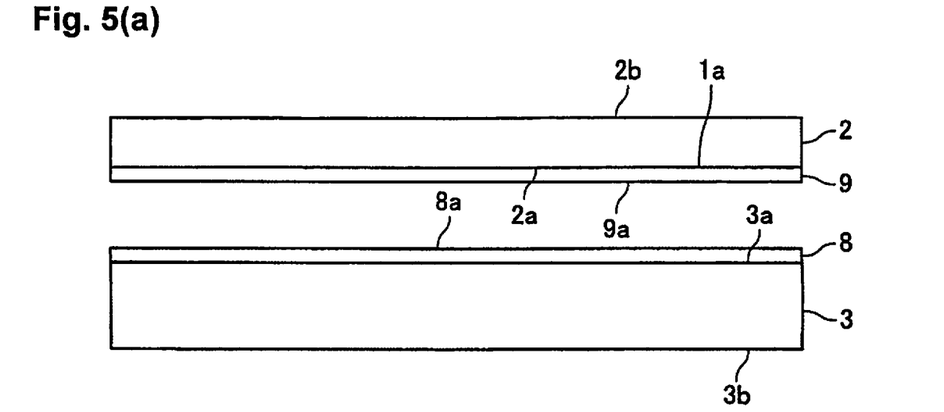
Figure 5B:
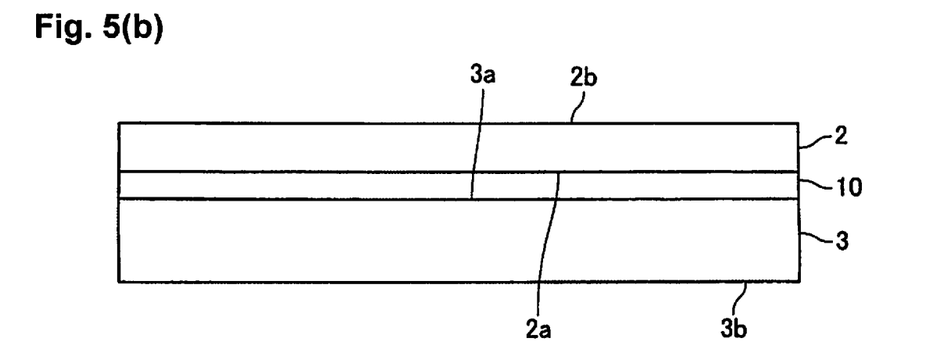

Specifically, it was used a lithium tantalate (LT substrate) having an orientation flat part (OF), a diameter of 4 inches and thickness of 250 µm, as the piezoelectric material substrate 2. Further, as the supporting body 3, it was prepared a silicon substrate having an OF part, a diameter of 4 inches and thickness of 230 µm. It was used the LT substrate of 46° Y-cut X-propagation LT substrate in which an acoustic surface wave (SAW) propagated in X-direction and the cutting angle was rotated Y-cut plate. The surface 2a of the piezoelectric material substrate 2 and the surface 3a of the supporting body 3 were mirror-polished so that the arithmetic surface roughnesses Ra were made 1 nm. The arithmetic surface roughnesses were evaluated in a square visual field of a length of 10 µm and a width of 10 µm by means of an atomic force microscope (AFM).

It was then film-formed the silicon oxide film having a thickness of 3.0 µm on the surface 2a of the piezoelectric material substrate 2 by sputtering. The arithmetic average surface roughness Ra after the film formation was 2 nm. It was further formed a silicon oxide film 8 having a thickness of 3.0 nm on a surface 3a of the supporting body 3 by sputtering. Ra after the film-formation was 2 nm. The respective silicon oxide films were then subjected to chemical mechanical polishing (CMP) so that the respective thicknesses reached 2.5 nm and Ra reached 0.3 nm.

The bonding surfaces 8a and 9a of the silicon oxide films were washed and subjected to removal of contamination, followed by introducing in a vacuum chamber. The respective bonding surfaces 8a and 9a were activated by plasma activation method and bonded with each other (refer to FIG. 5(b)). 10 represents a bonding layer. The inside pressure of the chamber was made 10 Pa, $O_2$ plasma was irradiated for 60 seconds, and the bonding was performed at a load of 1000N for 100 seconds.

Figure 5C:
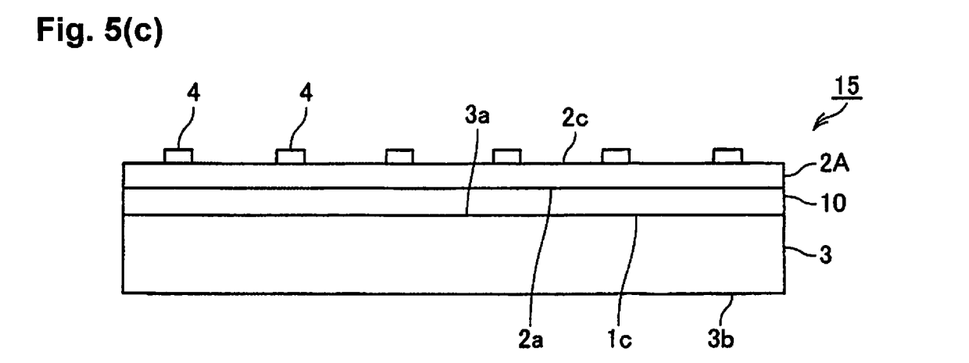

The surface 2b of the piezoelectric material substrate 2 was ground and polished so that the thickness was changed from the initial 250 µm to 3 µm (refer to FIG. 5(c)). The peeling of the bonded region was not confirmed during the grinding and polishing. Further, the bonding strength was evaluated by crack opening method and proved to be 0.6 J/m². An electrode 4 was formed on the processed surface 2c of the piezoelectric material substrate 2A after the grinding and polishing to obtain the acoustic wave device 15.

An acoustic wave device chip was produced from the acoustic wave device 15 and the propagation loss and temperature characteristics of frequency were measured.

Specifically, the IDT electrode 4 for generating acoustic surface wave was formed by photolithography step. After the electrode 4 was formed, the device was cut into small chips by dicing to obtain device chips each having sizes of 5 mm in the direction of propagation and 4 mm in the vertical direction. It was further prepared a reference substrate having the same sizes without the IDT electrode 4 for measuring a linear expansion coefficient.

The temperature characteristics of frequency of the device chip with the IDT electrode 4 formed was measured in a range of 25 to 80° C. and was proved to be −20 ppm/K.

Further the propagation loss was proved to be −2.4 dB. Further, the measurement results of the present example were summarized in table 1.

Comparative Example 2

According to the present example, the lithium niobate substrate and quartz crystal plates were directly bonded with each other by plasma activation method to produce the acoustic wave device 15.

Specifically, it was used a lithium tantalate (LT substrate) having an orientation flat part (OF), a diameter of 4 inches and thickness of 250 µm, as the piezoelectric material substrate 2. Further, as the supporting body 3, it was prepared a silicon substrate having an OF part, a diameter of 4 inches and thickness of 230 µm. It was used the LT substrate of 46° Y-cut X-propagation LT substrate in which an acoustic surface wave (SAW) propagated in X-direction and the cutting angle was rotated Y-cut plate. The surface 2a of the piezoelectric material substrate 2 and the surface 3a of the supporting body 3 were mirror-polished so that the arithmetic surface roughnesses Ra were made 1 nm.

The surface 2a of the piezoelectric material substrate 2 and surface 3a of the supporting body 3 were directly bonded, under the same conditions as those in the comparative example 1. However, different from the comparative example 1, the silicon oxide films 8 and 9 were not formed as the bonding layer according to the comparative example 2. The surface 2b of the piezoelectric material substrate 2 was ground and polished so that the thickness was changed from the initial 250 µm to 3 µm. The peeling of the bonded region was not confirmed during the grinding and polishing. Further, the bonding strength was evaluated by crack opening method and proved to be 0.6 J/m². The electrode 4 was formed on the processed surface 2c of the piezoelectric material substrate 2A after the grinding and polishing to obtain the acoustic wave device 15.

An acoustic wave device chip was then produced from the acoustic wave device 15 and the propagation loss and temperature characteristics of frequency were measured, according to the same procedure as that in the comparative example 1. The results were shown in table 1. The temperature characteristics of frequency of the device chip with the IDT electrode formed was measured in a range of 25 to 80° C. and was proved to be −22 ppm/K. Further the propagation loss was proved to be −2.5 dB.

Inventive Example 1

The acoustic wave device 5 was produced, according to the procedure described referring to FIGS. 1 and 2.

Specifically, it was used a lithium tantalate (LT substrate) having an orientation flat part (OF), a diameter of 4 inches and thickness of 250 µm, as the piezoelectric material substrate 2. It was further prepared a quartz crystal plate 1 having a diameter of 4 inches and thickness of 250 µm. Further, it was prepared a silicon substrate having an OF part, a diameter of 4 inches and thickness of 230 µm, as the supporting body 3. It was used the LT substrate of 46° Y-cut X-propagation LT substrate in which an acoustic surface wave (SAW) propagated in X-direction and the cutting angle was rotated Y-cut plate. The surface 2a of the piezoelectric material substrate 2 and the surface 3a of the supporting body 3 were mirror-polished so that the arithmetic surface roughnesses Ra were made 1 nm.

The bonding surfaces 2a of the piezoelectric material substrate 2 and the bonding surface 1a of the quartz crystal plate 1 were then subjected to chemical mechanical polishing so that Ra reached 0.3 nm or less. The bonding surfaces 2a and 1a were then washed and subjected to removal of contamination, followed by introducing in a vacuum chamber. The respective bonding surfaces 2a and 1a were activated by plasma activation method and bonded with each other. The inside of the chamber was made 10 Pa, $O_2$ plasma was irradiated for 60 seconds, and the bonding was performed at 1000N for 100 seconds.

The quartz crystal plate 1 was then ground and polished to a thickness of 0.1 µm to obtain the bonding layer 1A (refer to FIG. 1(c)). The bonding surfaces 1c of the bonding layer 1A and the bonding surface 3a of the supporting body 3 were then subjected to chemical mechanical polishing so that Ra reached 0.3 nm or less. The bonding surfaces 1c and 3a were then washed and subjected to removal of contamination, followed by introducing in a vacuum chamber. The respective bonding surfaces were activated by plasma activation method and bonded with each other (refer to FIG. 2(a)).

The surface 2b of the piezoelectric material substrate 2 was ground and polished so that the thickness was changed from the initial 250 µm to 3 µm (refer to FIG. 2(b)). The peeling of the bonded region was not confirmed during the grinding and polishing. Further, the bonding strength was evaluated by crack opening method and proved to be 0.6 J/m².

An acoustic wave device chip was then produced from the acoustic wave device 5 and the propagation loss and temperature characteristics of frequency were measured, according to the same procedure as that in the comparative example 1. The temperature characteristics of frequency of the device chip with the IDT electrode 4 formed was measured in a range of 25 to 80° C. and was proved to be −15 ppm/K. Further, the propagation loss was proved to be −1.9 dB. The results of measurement were shown in table 1. As can be seen from the results, the acoustic wave device 5 produced in the inventive example 1 has good temperature characteristics of frequency and low propagation loss of acoustic wave while the bonding strength can be maintained.

Inventive Examples 2 to 5

The acoustic wave devices of the respective examples were produced according to the same procedure as the inventive example 1. However, the thickness of each bonding layer 1A composed of quartz crystal was variously changed as shown in table 1. Specifically, the thickness of the bonding layer 1A was 0.5 µm in the inventive example 2, the thickness of the bonding layer 1A was 5.0 µm in the inventive example 3, the thickness of the bonding layer 1A was 10.0 µm in the inventive example 4, and the thickness of the bonding layer 1A was 20 µm in the inventive example 5.

The bonding strength of the bonded body, and the propagation loss and temperature characteristics of frequency of each of the thus obtained acoustic wave devices 5 according to the respective examples were shown in table 1. The temperature characteristics of frequency of the device with the IDT electrode 4 formed was measured in a range of 25 to 80° C. and was proved to be −14 ppm/K in the inventive example 2, −15 ppm/K in the inventive example 3, −16 ppm/K in the inventive example 4, and −21 ppm/K in the inventive example 5. Further the propagation loss was proved to be −1.1 dB in the inventive example 2, −1.1 dB in the inventive example 3, −1.2 dB in the inventive example 4, and −2.3 dB in the inventive example 5.

As can be seen from the results, the acoustic wave device 5 produced in each of the inventive examples 2 to 5 has good temperature characteristics of frequency and low propagation loss of acoustic wave while the bonding strength can be maintained.

TABLE 1

| | Material of bonding layer | Thickness of bonding layer (μm) | Intermediate layer on the side of piezoelectric material substrate | Intermediate layer on the side of supporting body | Material of supporting body | Bonding method | Bonding strength (J/m2) | Propagation loss (dB) | Temperature characteristics of frequency (ppm/K) |
|---|---|---|---|---|---|---|---|---|---|
| Com. Ex. 1 | SiO2 | 5 | — | — | Si | Plasma | 0.6 | −2.4 | −20 |
| Com. Ex. 2 | — | — | — | — | Quartz | Plasma | 0.6 | −2.5 | −22 |
| Inv. Ex. 1 | Quartz | 0.1 | — | — | Si | Plasma | 0.6 | −1.9 | −15 |
| Inv. Ex. 2 | Quartz | 0.5 | — | — | Si | Plasma | 0.6 | −1.1 | −14 |
| Inv. Ex. 3 | Quartz | 5.0 | — | — | Si | Plasma | 0.6 | −1.1 | −15 |
| Inv. Ex. 4 | Quartz | 10.0 | — | — | Si | Plasma | 0.6 | −1.2 | −16 |
| Inv. Ex. 5 | Quartz | 20.0 | — | — | Si | Plasma | 0.6 | −2.3 | −21 |

Inventive Example 6

The acoustic wave device 5A was produced according to the procedure described referring to FIGS. 3 and 4.

Specifically, it was prepared the piezoelectric material substrate 2, quartz crystal plate 1 and supporting body 3 same as those in the inventive example 1.

It was formed, on the bonding surface 1a of the quartz crystal plate 1, the intermediate layer 6 on the side of the piezoelectric material substrate made of tantalum pentoxide and having a thickness of 0.05 μm by sputtering. The bonding surface 2a of the piezoelectric material substrate 2 and bonding surface 6a of the intermediate layer 6 on the side of the piezoelectric material substrate were washed and subjected to removal of contamination, followed by introducing in a vacuum chamber. The inside of the chamber was drawn to vacuum of the order of $10^{-6}$ Pa, and high-speed atomic beam (acceleration voltage of 1 kV and Ar flow rate of 27 sccm) was irradiated on the bonding surfaces of the respective substrates for 120 seconds. The bonding surface 2a of the piezoelectric material substrate 2 and bonding surface 6a of the intermediate layer 6 on the side of the piezoelectric material substrate were then contacted with each other, followed by pressuring at 10000 N for 2 minutes so that the piezoelectric material substrate 2 and quartz crystal plate 1 were bonded with each other (FIG. 3(b)).

The quartz crystal plate 1 was then ground and polished to a thickness of 5.0 μm to obtain the bonding layer 1A (refer to FIG. 3(c)). It was formed, on the bonding surface 1c of the bonding layer 1A, the intermediate layer 7 on the side of the supporting layer made of tantalum pentoxide and having a thickness of 0.05 μm by sputtering. The bonding surface 3a of the supporting body 3 and bonding surface 7a of the intermediate layer 7 on the side of the supporting body were washed and subjected to removal of contamination, followed by introducing in a vacuum chamber. The inside of the chamber was drawn to vacuum of the order of $10^{-6}$ Pa, and high-speed atomic beam (acceleration voltage of 1 kV and Ar flow rate of 27 sccm) was irradiated on the bonding surfaces of the respective substrates for 120 seconds. The bonding surface 3a of the supporting body 3 and bonding surface 7a of the intermediate layer 7 on the side of the supporting body were then contacted with each other, followed by pressuring at 10000N for 2 minutes so that the supporting body 3 and piezoelectric material substrate 2 were bonded with each other (FIG. 4(b)).

The surface 2b of the piezoelectric material substrate 2 was ground and polished so that the thickness was changed from the initial 250 μm to 3 μm (refer to FIG. 4(b)). The peeling of the bonded region was not confirmed during the grinding and polishing. Further, the bonding strength was evaluated by crack opening method and proved to be 1.5 J/m².

An acoustic wave device chip was then produced from the acoustic wave device 5A and the propagation loss and temperature characteristics of frequency were measured, according to the same procedure as that in the comparative example 1. The results of measurement were shown in table 2. According to the inventive example 6, the temperature characteristics of frequency of the device chip with the IDT electrode 4 formed was measured in a range of 25 to 80° C. and was proved to be −15 ppm/K. Further the propagation loss was proved to be as low as −0.9 dB. Further, the bonding strength was proved to be 1.5 J/m².

Inventive Examples 7, 8

The acoustic wave devices 5A were produced according to the same procedure as the inventive example 6, and the bonding strength, propagation loss and temperature characteristics of frequency were measured. The measurement results were shown in table 2.

However, the material of the supporting body 3 was changed to sialon in the inventive example 7 and mullite in the inventive example 8. The temperature characteristics of frequency in a range of 25 to 80° C. of the device with the IDT electrode 4 formed was measured and proved to be −10 ppm/K in the inventive example 7 and −14 ppm/K in the inventive example 8. Further, the propagation loss was proved to be as low as −0.7 dB in the inventive example 7 and as low as −0.7 dB in the inventive example 8. Further, the bonding strength was proved to be 1.5 J/m² as the inventive example 6. As can be seen from the results, the acoustic wave devices 5 produced in the inventive examples 6 to 8 have improved strengths, low propagation losses of acoustic wave and good temperature characteristics of frequency.

TABLE 2

| | Material of bonding layer | Thickness of bonding layer (μm) | Intermediate layer on the side of piezoelectric material substrate | Intermediate layer on the side of supporting body | Material of supporting body | Bonding method | Bonding strength (J/m2) | Propagation loss (dB) | Temperature characteristics of frequency (ppm/K) |
|---|---|---|---|---|---|---|---|---|---|
| Inv. EX. 6 | Quartz | 5.0 | Ta2O5 (0.05 μm) | Ta2O5 (0.05 μm) | Si | FAB | 1.5 | −0.9 | −15 |
| Inv. Ex. 7 | Quartz | 5.0 | Ta2O5 (0.05 μm) | Ta2O5 (0.05 μm) | Sialon | FAB | 1.5 | −0.7 | −10 |
| Inv. Ex. 8 | Quartz | 5.0 | Ta2O5 (0.05 μm) | Ta2O5 (0.05 μm) | Mullite | FAB | 1.5 | −0.7 | −14 |

As described above, according to the present invention, it was proved that the bonding strength was comparable with that of the comparative example and that the insertion loss and temperature characteristics of frequency were improved as a whole.

Further, according to the inventive examples 1 to 5, the thickness of the bonding layer 1A composed of quartz crystal was 0.1 μm to 20 μm. In the case that the thickness of the bonding layer 1A is 0.05 μm to 30 μm, it is possible to produce the acoustic wave device having a low insertion loss and good temperature characteristics of frequency of acoustic wave, while maintain the bonding strength.

The invention claimed is:

1. An acoustic wave device comprising:
   a piezoelectric material substrate;
   an electrode on said piezoelectric material substrate;
   a supporting body; and
   a bonding layer for bonding said piezoelectric material substrate and said supporting body,
   wherein said bonding layer comprises quartz crystal,
   wherein said acoustic wave device further comprises an intermediate layer on a side of said piezoelectric material substrate, said intermediate layer comprising one or more materials selected from the group consisting of tantalum pentoxide, niobium pentoxide, titanium oxide and a high-resistant silicon and being provided between said bonding layer and said piezoelectric material substrate, and
   wherein said acoustic wave device further comprises an intermediate layer on a side of said supporting body, said intermediate layer on the side of said supporting body comprising one or more materials selected from the group consisting of tantalum pentoxide, niobium pentoxide, titanium oxide and a high-resistant silicon and being provided between said bonding layer and said supporting body.

2. The acoustic wave device of claim 1, wherein said bonding layer has a thickness of 0.05 μm or larger and 30 μm or smaller.

3. The acoustic wave device of claim 1, wherein said supporting body comprises a material selected from the group consisting of silicon, sialon, mullite, sapphire and translucent alumina.

4. A method of producing an acoustic wave device, the method comprising the steps of:
   bonding a piezoelectric material substrate and a quartz crystal plate;
   processing said quartz crystal plate to form a bonding layer:
   providing an intermediate layer on a side of said supporting body, said intermediate layer comprising one or more materials selected from the group consisting of tantalum pentoxide, niobium pentoxide, titanium oxide and a high-resistant silicon and being provided between said bonding layer and said supporting body,
   bonding said supporting body and said intermediate layer on the side of said supporting body by surface activation method with a neutralized beam; and
   forming an electrode on said piezoelectric material substrate.

5. The method of claim 4, wherein said bonding layer has a thickness of 0.05 μm or larger and 30 μm or smaller.

6. The method of claim 4, further comprising the step of:
   providing an intermediate layer on a side of said piezoelectric material substrate, said intermediate layer on a side of said piezoelectric material substrate comprising one or more materials selected from the group consisting of tantalum pentoxide, niobium pentoxide, titanium oxide and a high-resistant silicon and being provided between said piezoelectric material substrate and said quartz crystal plate.

7. The method of claim 4, wherein said supporting body comprises a material selected from the group consisting of silicon, sialon, mullite, sapphire and translucent alumina.

* * * * *